United States Patent [19]

Holt

[11] Patent Number: 4,714,510

[45] Date of Patent: Dec. 22, 1987

[54] METHOD OF BONDING PROTECTIVE COVERS ONTO SOLAR CELLS

[75] Inventor: James F. Holt, Medway, Ohio

[73] Assignee: The United States of America as represented by the Secretary of the Air Force, Washington, D.C.

[21] Appl. No.: 900,055

[22] Filed: Aug. 25, 1986

[51] Int. Cl.⁴ ............... C03C 27/02; C03C 27/10; H01L 31/00; H01L 31/18

[52] U.S. Cl. ............... 437/2; 156/99; 156/152; 156/273.1; 65/59.1; 65/59.26; 65/59.32; 136/256; 437/209

[58] Field of Search ............ 156/99, 104, 152, 273.1; 29/572; 65/59.1, 59.26, 59.32; 136/256

[56] References Cited

U.S. PATENT DOCUMENTS

| | | | |
|---|---|---|---|
| 3,341,649 | 9/1967 | James | 29/576 S |
| 3,472,698 | 10/1969 | Mandelkorn | 136/89 |
| 3,690,953 | 9/1972 | Wise | 357/32 X |
| 3,951,707 | 4/1976 | Kurtz et al. | 156/3 |
| 3,985,579 | 10/1976 | Rahilly | 29/572 X |
| 4,273,950 | 6/1981 | Chitre | 136/255 |
| 4,348,546 | 9/1982 | Little | 136/256 |
| 4,349,691 | 9/1982 | Lindmayer | 136/261 |
| 4,409,423 | 10/1983 | Holt | 136/255 |
| 4,420,650 | 12/1983 | Wise | 136/255 |

Primary Examiner—Robert A. Dawson
Assistant Examiner—Jeff H. Aftergut
Attorney, Agent, or Firm—Bobby D. Scearce; Donald J. Singer

[57] ABSTRACT

A method for bonding a protective cover to a solar cell is described comprising the steps of depositing onto a substrate a metallic gridwork corresponding to that which surrounds and defines the active photovoltaic areas of the solar cell; overlaying a protective cover, such as of glass, in contact with the gridwork on the substrate, heating under light pressure to soften the cover and impress the gridwork into a surface of the cover, and removing the cover and gridwork assembly from the substrate; applying a thin metallic adherent layer and, optionally, a compatibility layer on the solar cell in configuration corresponding to that of the intended gridwork of the solar cell; overlaying the cover and gridwork assembly onto the solar cell with the gridwork aligned with the layer(s); and bonding the gridwork to the layer(s).

7 Claims, 7 Drawing Figures

METHOD OF BONDING PROTECTIVE COVERS ONTO SOLAR CELLS

RIGHTS OF THE GOVERNMENT

The invention described herein may be manufactured and used by or for the Government of the United States for all governmental purposes without the payment of any royalty.

BACKGROUND OF THE INVENTION

The present invention relates generally to fabrication methods for solar cells, and more particularly to a novel method for bonding protective covers to an active surface of a solar cell.

The basic structure and operation of solar cells is well known and the use of silicon solar cells for electrical power generation for remote marine, terrestrial and satellite applications is well documented. The development of vertical junction solar cells met a need for radiation resistant cells with improved electrical conversion efficiency for operation in an ionizing radiation environment to which a cell may be subjected in extraterrestrial applications. The state of the art relating to vertical junction solar cells may be exemplified by solar cell configurations disclosed by or referenced in U.S. Pat. No. 3,690,953 titled "Vertical Junction Hardened Solar Cell", U.S. Pat. No. 3,985,579 titled "Rib and Channel Vertical Multijunction Solar Cell", U.S. Pat. No. 4,409,423 titled "Hole Matrix Vertical Junction Solar Cell", and U.S. Pat. No. 4,420,650 titled "Wedged Channel Vertical Junction Silicon Solar Cell".

Vertical junction solar cell structures known in the prior art may comprise a variety of configurations defining the vertical junctions of the solar cells. One such configuration includes a plurality of narrow grooves or channels etched into the surface of a semiconductor substrate, the channels providing the areas upon which the photovoltaic junction of the cell is diffused, the narrow ribs of the structure which define channels providing the vertical junctions for the cell. Another configuration is a silicon chip having in one surface a plurality of short, wedge shaped channels closely spaced in an array and separated by thin vertical ribs, the photovoltaic junction being diffused over the rib surfaces and chip surfaces between the ribs. Another cell configuration includes a silicon chip having in one surface a plurality of holes closely spaced in an array, the vertical junction areas being provided on the walls defining the holes.

The structures of the solar cells such as those just described may be exceedingly fragile, which often necessitates the bonding of a protective plate over the active surfaces of the solar cell in order to protect the photovoltaic junction areas of the cell from damage resulting from excessive heat or pressure, from physical impact, or from excessive or invasive radiation.

The invention is directed to a method of bonding a protective cover, such as of glass, to a solar cell to minimize vulnerability of the cell to damage during fabrication as well as during service. In the practice of the invention, a thin layer of metal is evaporated onto the solar cell chip in preselected configuration corresponding to that of the electrical gridwork of the completed solar cell; the thicker metallic current carrying electrical gridwork of the solar cell is deposited separately on a substrate and impressed into the protective cover; the cover containing the gridwork is then pressed onto and bonded to the solar cell chip with the gridwork in the cover in registration with the thin metal layer on the solar cell chip. The bonding of cover to chip in the process of the invention may be performed at a lower temperature than that required in conventional electrostatic bonding, which permits successful bonding and cell assembly without impairing the electrical performance of the solar cell.

It is therefore a principal object of the invention to provide an improved solar cell fabrication method.

It is a further object of the invention to provide an improved method for bonding a protective cover to a solar cell.

It is another object of the invention to provide a low temperature, low pressure method for bonding protective covers to solar cells.

It is yet another object of the invention to provide an improved solar cell structure.

These and other objects of the invention will become apparent as the description of representative embodiments proceeds.

SUMMARY OF THE INVENTION

In accordance with the foregoing principles and objects of the invention, a method for bonding a protective cover to a solar cell is described comprising the steps of depositing onto a substrate a metallic gridwork corresponding to that which surrounds and defines the active photovoltaic areas of the solar cell; overlaying a protective cover, such as of glass, in contact with the gridwork on the substrate, heating under light pressure to soften the cover and impress the gridwork into a surface of the cover, and removing the cover and gridwork assembly from the substrate; applying a thin metallic adherent layer and, optionally, a compatibility layer on the solar cell in configuration corresponding to that of the intended gridwork of the solar cell; overlaying the cover and gridwork assembly onto the solar cell with the gridwork aligned with the layer(s); and bonding the gridwork to the layer(s).

DESCRIPTION OF THE DRAWINGS

The invention will be more clearly understood from the following detailed description of representative embodiments read in conjunction with the accompanying drawings wherein.

DETAILED DESCRIPTION

Figure 1:
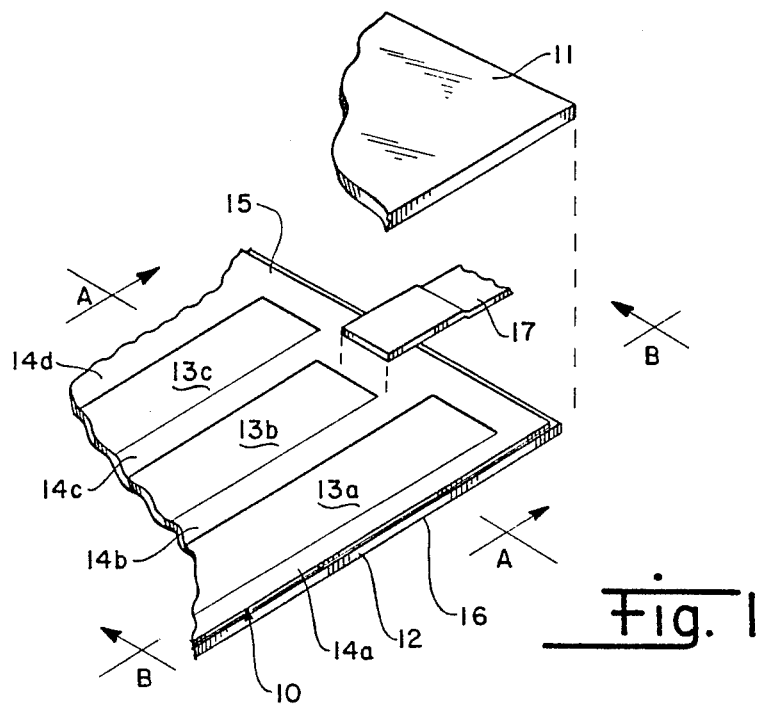
FIG. 1 is an exploded fragmentary view of a solar cell assembly of the invention.
Figure 1A:
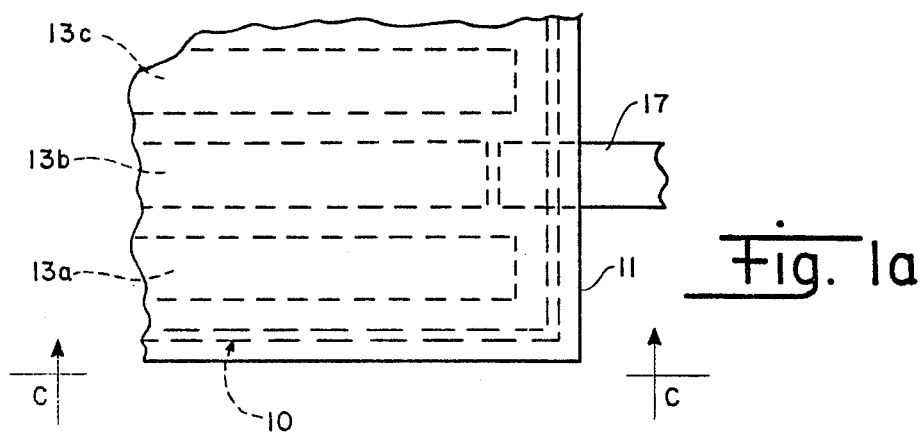
FIG. 1a is a fragmentary plan view of the FIG. 1 assembly.

Referring now to FIG. 1, shown therein is an exploded fragmentary perspective view of a solar cell and protective cover assembly. FIG. 1a is a plan view of the assembly depicted in FIG. 1. A solar cell 10 to which may be bonded a transparent protective cover 11 according to the method of the invention may typically include a thin silicon chip 12, typically about two centimeters square and having one or more (usually about 12 to 24) active areas 13a,b,c defined thereon which include the photovoltaic junctions of the solar cell. The method of the invention is most applicable to solar cell 10 structures including a plurality of metallic electrical contact strips 14a,b,c,d between and defining active areas 13. The photovoltaic junctions may take any form known in the art, such as those described in the patents referenced above. Header strip 15 joins contact strips 14 to provide an electrical contact for solar cell 10. Another electrical contact 16 is formed on the bottom surface of solar cell 10 and may take the form of a metallized coating. One or more electrical contact tabs 17 contacting header strip 15 provides means to interconnect the upper active surface area of solar cell 10 with an electrical circuit (not shown).

Figure 2A:
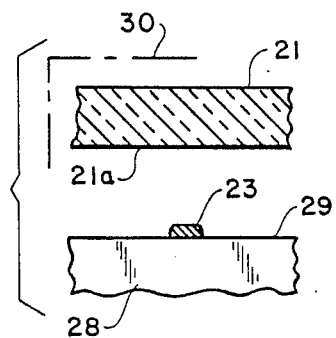
FIGS. 2a and 2b are front and side views of the cover and electrical contact strips and tab illustrating the assembly thereof in preparation for attachment to a solar cell.
Figure 2B:
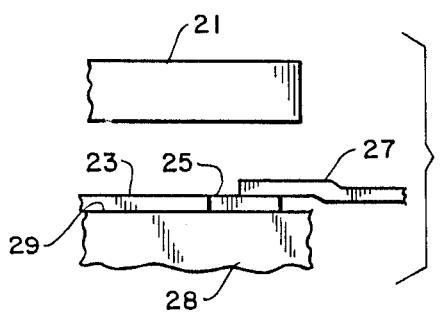

Referring now to FIGS. 2a and 2b, shown therein are sectional and side views, respectively, of a protective cover 21 of the type utilized in assembling a solar cell according to the invention and electrical contact strip 23, header strip 25 and tab 27 illustrating assembly thereof for subsequent attachment to a suitably configured solar cell. In the method of the invention, a protective cover 21 is first prepared by impressing into surface 21a the grid bars forming the electrical contact strips 23, header strip 25, and contact tab 27 of an assembled solar cell. Cover 21 may comprise any suitable transparent material conventional to the purpose of protectively covering a solar cell as herein described, and may include Corning glasses types 7070, 0080, 0010, or other material preferably having a relatively low softening temperature as defined herein.

A suitable substrate or base 28 having a smooth flat surface 29 is first prepared for receiving by deposition a grid defining contact strips 23, header strip 25 and tab 27 of the structure illustrated in FIG. 2a. Base 28 may comprise any suitable material on which the metals comprising the contact strips and tabs may be deposited, including a flat block of ceramic, graphite, or the like to which the glass comprising cover 21 and the metals comprising contact strips 23, header 25 and tabs 27 will not adhere strongly. Contact strip(s) 23, header strip 25 and tab(s) 27 form the main current carrying portion of the completed solar cell and conventionally comprise various layers of silver, titanium, palladium, nickel, aluminum, or gold deposited to a thickness of from about one to about six microns by evaporation, sputtering, and/or by plating, or other suitable deposition process. As suggested above, there may be a plurality of electrical contact strips 23 and tabs 27 in an assembled solar cell, but for simplicity of illustration, but one each electrical contact strip 23 and tab 27 are illustrated in FIGS. 2a and 2b.

The electrical gridwork including contact strips 23, header 25 and tabs 27 having been deposited onto base 28, cover 21 is pressed thereover and the gridwork and cover bonded together under inert gas or vacuum, as appropriate, by heating under light pressure. Accordingly, cover 21 and base 28 with the gridwork thereon may be heated under modest pressure of about 5 to 30 psi by suitable means (such as in furnace 30 represented by broken peripheral line in FIG. 2a) in order to impress the electrical gridwork into surface 21a of cover 21. For most glasses suitable for a solar cell assembly according to the invention, a heating temperature of from about 500° C. to about 650° C. sufficiently softens surface 21a to impress the electrical gridwork thereon. For Corning type 7070 glass, a temperature of about 550° C. to about 600° C. provides suitable surface softening for bonding of the electrical gridwork thereto. Alternatively, the electrical gridwork comprising contact strips 23, header 25 and tabs 27 may be prepared by stamping from metal foil of appropriate thickness, and the stamped gridwork then bonded to and impressed into a surface of cover 21 substantially as described. The upper portions of FIGS. 3a and 3b show sectional and side elevational views of the assembly of the electrical gridwork and cover 21 following bonding as just described.

Figure 3A:
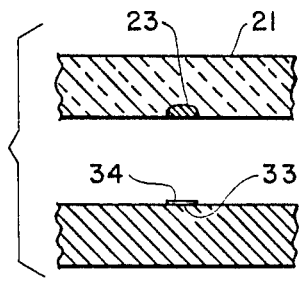
FIGS. 3a and 3b are a sectional view of the assembly of FIG. 1 along line A—A and an elevational view along line B—B.
Figure 3B:
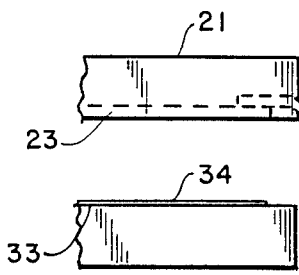

Referring further to FIGS. 3a and 3b, shown therein in exploded fashion are a sectional view along line A—A of FIG. 1 and an elevational view along line B—B. In fabricating a solar cell according to the invention as depicted in FIG. 1, the electrical gridwork is applied to chip 12 in the configuration depicted by first evaporating a thin metallic film 33 of metal to the surface of chip 12 in the configuration and location of the gridwork to provide substantial adherence to the chip, and then optionally electroplating a second thin film 34 of metal over the first film 33 to provide substantial bonding to the gridwork impressed into cover 21 as described above. It is understood that in certain applications wherein the metal comprising the gridwork impressed into cover 21 may be applied to chip 12 with good adherence, both an adherence layer and a compatibility layer may not be required. Metals for films 33,34 may be selected as would occur to one skilled in the field of the invention and may include the group listed above for the grid. The first thin evaporated layer may typically comprise, for example, 500 angstroms of titanium, and the second electroplated coat may comprise 500 angstroms of palladium. For a solar cell of the dimensions described above and depicted in FIGS. 1 and 1a, the adherence and compatibility coats are deposited onto chip 12 at the location of the contact strips about 200 to 500 microns wide, whereas the coats at the header strip are somewhat wider. The gridwork impressed into the surface of cover 21 as described above in relation to FIGS. 2a,b and 3a,b are somewhat narrower than corresponding portions of the adherence and compatibility layers in order to prevent the gridwork of cover 21 from directly touching solar cell 12.

Figure 4:
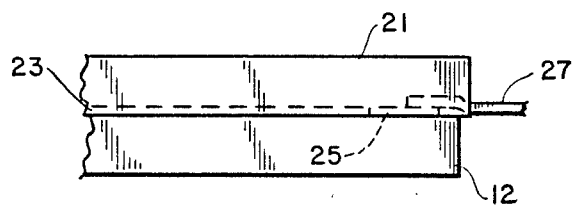
FIG. 4 is a side view of the assembly of FIG. 1a along line C—C.

Once chip 12 of the solar cell is prepared, cover 21 is placed over chip 12 as shown in FIG. 4 with the gridwork of the cover aligned with the previously applied metallic coat(s) on chip 12. Cover 21 is then pressed onto chip 12, and the gridwork of the cover is bonded to the compatibility layer on chip 12 by electrostatic bonding or other suitable process (see, e.g., Air Force technical report AFAPL-TR-75-54). The resulting structure provides electrical contact between the active surface of chip 12 and tab 17 through the gridwork bonded to the protective cover. It is noted that, whereas conventional electrostatic bonding requires a bonding temperature of about 550°-600° C., the bonding step of the invention may be performed at lower temperature (about 400° C.) by reason of the novel structure generated within the process.

The process just described is readily adaptable to mass production, the details of which are outside the scope of these teachings and which may readily occur to one skilled in the appropriate solid state art guided by these teachings.

It is understood that other methods may be used to bond the gridwork impressed in the protective cover to the metal layer(s) deposited on the chip, for example, by soldering, wherein the exposed surface of the gridwork is coated with a suitable low melting solder which is compatible with the compatibility layer of the chip, and, during subsequent electrostatic bonding of the cover to the chip, the solder is melted and fluxed to make a soldered bond. Further, the cover may be welded to the chip under suitable conditions of heat and pressure. The tab may be separately soldered or welded to the gridwork instead of forming an integral part thereof as suggested in the foregoing discussion.

The invention therefore provides an improved method for bonding covers to solar cells and thereby providing protection to the photovoltaic junctions of the cells. It is understood that certain modifications to the invention as described may be made, as might occur to one with skill in the field of the invention, within the scope of the appended claims. Therefore, all embodiments contemplated hereunder which achieve the objects of the invention have not been shown in complete detail. Other embodiments may be developed without departing from the spirit of the invention or from the scope of the appended claims.

I claim:

1. A method for bonding a protective cover to a solar cell having on an active surface thereof at least one area including the photovoltaic junction of said solar cell and a metallic gridwork defining said at least one area and providing an electrical contact for said solar cell, said method comprising the steps of:
   (a) providing a substrate;
   (b) depositing onto said substrate said metallic gridwork of said solar cell;
   (c) overlaying said cover in contact with said metallic gridwork on said substrate;
   (d) heating said cover, metallic gridwork and substrate under pressure to impress said metallic gridwork into the surface of said cover contacting said metallic gridwork;
   (e) removing said cover and metallic gridwork from said substrate;
   (f) applying a thin metallic adherent layer on said solar cell in configuration corresponding to that of said metallic gridwork of said solar cell;
   (g) applying a metallic compatibility layer to said solar cell over said metallic adherent layer in substantially identical configuration thereto;
   (h) overlaying said cover and metallic gridwork onto said solar cell with said metallic gridwork in registration with said metallic compatibility layer; and
   (i) bonding said metallic gridwork to said metallic compatibility layer where said cover is protectively attached to said solar cell.

2. The method recited in claim 1 wherein said cover comprises glass and said heating step is characterized by heating said cover, metallic gridwork and substrate to temperature sufficient to soften said glass.

3. The method recited in claim 2 wherein said heating step is performed at a temperature of from about 500° C. to about 650° C.

4. The method recited in claim 1 wherein said solar cell comprises a silicon chip.

5. The method recited in claim 1 wherein said metallic adherent layer comprises a metal selected from the group consisting of titanium, aluminum, silver, platinum, and nickel.

6. The method recited in claim 1 wherein said metallic compatibility layer comprises a metal selected from the group consisting of palladium, tungsten, rhenium, rhodium, nickel, and aluminum.

7. The method recited in claim 1 wherein step (i) is characterized by electrostatically bonding said metallic gridwork to said metallic compatibility layer.

* * * * *